United States Patent
Barmatz et al.

(10) Patent No.: US 6,905,945 B1
(45) Date of Patent: Jun. 14, 2005

(54) MICROWAVE BONDING OF MEMS COMPONENT

(75) Inventors: Martin B. Barmatz, La Cresenta, CA (US); John D. Mai, Pasadena, CA (US); Henry W. Jackson, La Verne, CA (US); Nasser K. Budraa, Riverside, CA (US); William T. Pike, London (GB)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/198,656

(22) Filed: Apr. 20, 2000

Related U.S. Application Data

(60) Provisional application No. 60/130,842, filed on Apr. 22, 1999.

(51) Int. Cl.$^7$ .............................. H01L 21/30
(52) U.S. Cl. ................ 438/455; 438/456; 228/180.22
(58) Field of Search ................ 438/106–109, 438/118, 119, 455–459, 612; 228/179.1, 180.1, 180.21, 180.22; 257/777, 778

(56) References Cited

U.S. PATENT DOCUMENTS

| | | | | |
|---|---|---|---|---|
| 5,172,852 A | * | 12/1992 | Bernardoni et al. ... | 228/180.21 |
| 5,346,857 A | * | 9/1994 | Scharr et al. .......... | 228/180.22 |
| 5,603,795 A | * | 2/1997 | Paulauskas et al. ...... | 156/272.4 |
| 5,846,854 A | | 12/1998 | Giraud et al. | |
| 5,985,693 A | * | 11/1999 | Leedy ......................... | 438/107 |
| 6,054,693 A | * | 4/2000 | Barmatz et al. ............ | 219/678 |
| 6,312,548 B1 | * | 11/2001 | Fathi et al. .............. | 156/275.1 |

FOREIGN PATENT DOCUMENTS

JP     11121531 A   *   4/1999         H01L/21/60

* cited by examiner

*Primary Examiner*—Carl Whitehead, Jr.
*Assistant Examiner*—Jennifer M Dolan
(74) *Attorney, Agent, or Firm*—Fish & Richardson P.C.

(57) ABSTRACT

Bonding of MEMs materials is carried out using microwave. High microwave absorbing films are placed within a microwave cavity, and excited to cause selective heating in the skin of the material. This causes heating in one place more than another. Thereby minimizing the effects of the bonding microwave energy.

10 Claims, 4 Drawing Sheets

MICROWAVE BONDING OF MEMS COMPONENT

CROSS-REFERENCE TO RELATED APPLICATIONS

This application claims benefit of U.S. Provisional Application No. 60/130,842, filed Apr. 22, 1999.

STATEMENT AS TO FEDERALLY-SPONSORED RESEARCH

The U.S. Government may have certain rights in this invention pursuant to Grant No. 7-1407 awarded by NASA.

BACKGROUND

Microelectrical mechanical or "MEMS" systems allow formation of physical features using semiconductor materials and processing techniques. The techniques enable the physical features to have relatively small sizes. A MEMS structure often requires two separated parts to become bonded. This can be difficult since too much heat can overheat and destroy delicate components.

SUMMARY

The present application teaches bonding MEMS structures using selective heating feature of microwave energy. A low temperature, low pressure wafer bonding, can be effected e.g. in a MEMS environment.

BRIEF DESCRIPTION OF THE DRAWINGS

These and other aspects will now be described in detail with respect to the accompanying drawings, wherein.

DETAILED DESCRIPTION

Bonding of MEMS structures has been carried out in the past using anodic bonding, thermal compression, or adhesives, such as polymer adhesives, between the layers. Other techniques have also been used. Each of these techniques has certain advantages and also its own host of limitations.

The present application discloses a way of bonding substrate using films such as a metal with a large imaginary dielectric constant $\in''$. Microwave energy causes heating effects predominately within the skin depth of such films. The skin depth can be, for example, about 1 µm.

This selective heating causes the skin depth in the metal film to be heated more than the parts of the metal film that are not within the skin depth. This can be very useful when bonding together materials in which the metal films are thin, e.g., of comparable thickness to the skin depth. The films can be less than 10 µm, and excellent effects are obtained when the films are less 1 µm. The metal is typically attached to a substrate, e.g., a silicon substrate. The silicon substrate may include semiconductor materials, e.g. materials which can be sensitive to heat.

Figure 1:
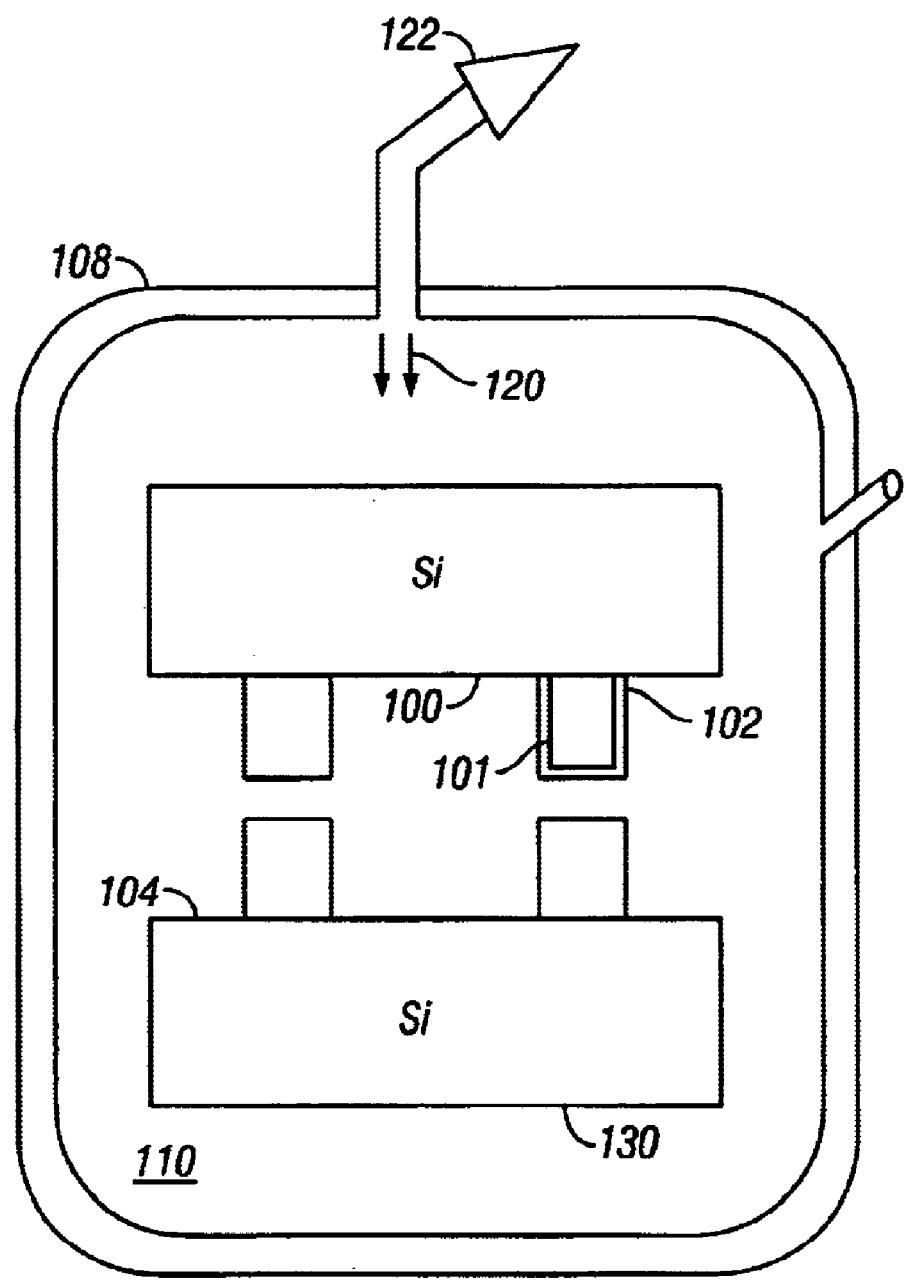
FIG. 1 shows a view of silicon substrates in a chamber.

An embodiment is shown in FIG. 1. This embodiment discloses bonding of two silicon substrates, each with two metal films, to each other. The metal is a high $\in''$ material while the silicon substrate lower $\in''$ material. The MEMS device is placed in a single mode cavity 110. Microwave radiation 120 is introduced into the cavity 110. The microwave radiation 120 selectively heats the materials in the cavity. Most of the heating effect from the microwave is deposited in the skin depth 101 of the metal 102. Note that the skin depth can be smaller or larger than the thickness of the metal film. This effectively concentrates the deposition energy in that skin depth causing the thin metal film to rapidly heat and melt. Bonding occurs relatively quickly, with minimal heating of the substrate 104. Of course, the substrate 104 is heated in the area of the gold 102 when the heat escapes from the heated gold. However, heating in the area 108 will generally be minimal due to the large heat capacity of the substrate 104.

Moreover, the bonding process time can be short, allowing for reduced diffusion of the metallization 102 into the silicon 104.

The microwave bonding can be carried out with no pressure or low pressure. This means that mechanically-induced stresses can be minimized.

As shown in FIG. 1, micromachining techniques may form a small cavity 130, e.g. of 0.1 to 8 microns in size. By surrounding this cavity with a continuous metal film, the heating can hermetically seal the cavity. This technique can lead to obtain leak rates at equal to or better than $3 \times 10^9$ atm-cc/s. The microwave cavity 110 can be evacuated or the substrates to be bonded can be within a vessel such as a quartz tube, that is evacuated to form a vacuum around the substrates.

This technique allows bonding using microwave heating only, requiring no pressure in the bonding area beyond the weight of the substrate connections. Furthermore, in a vacuum environment, hermetic seals can be formed where the pressure in the hermetic sealed cavity would not return to atmospheric for over one year.

Figure 2:
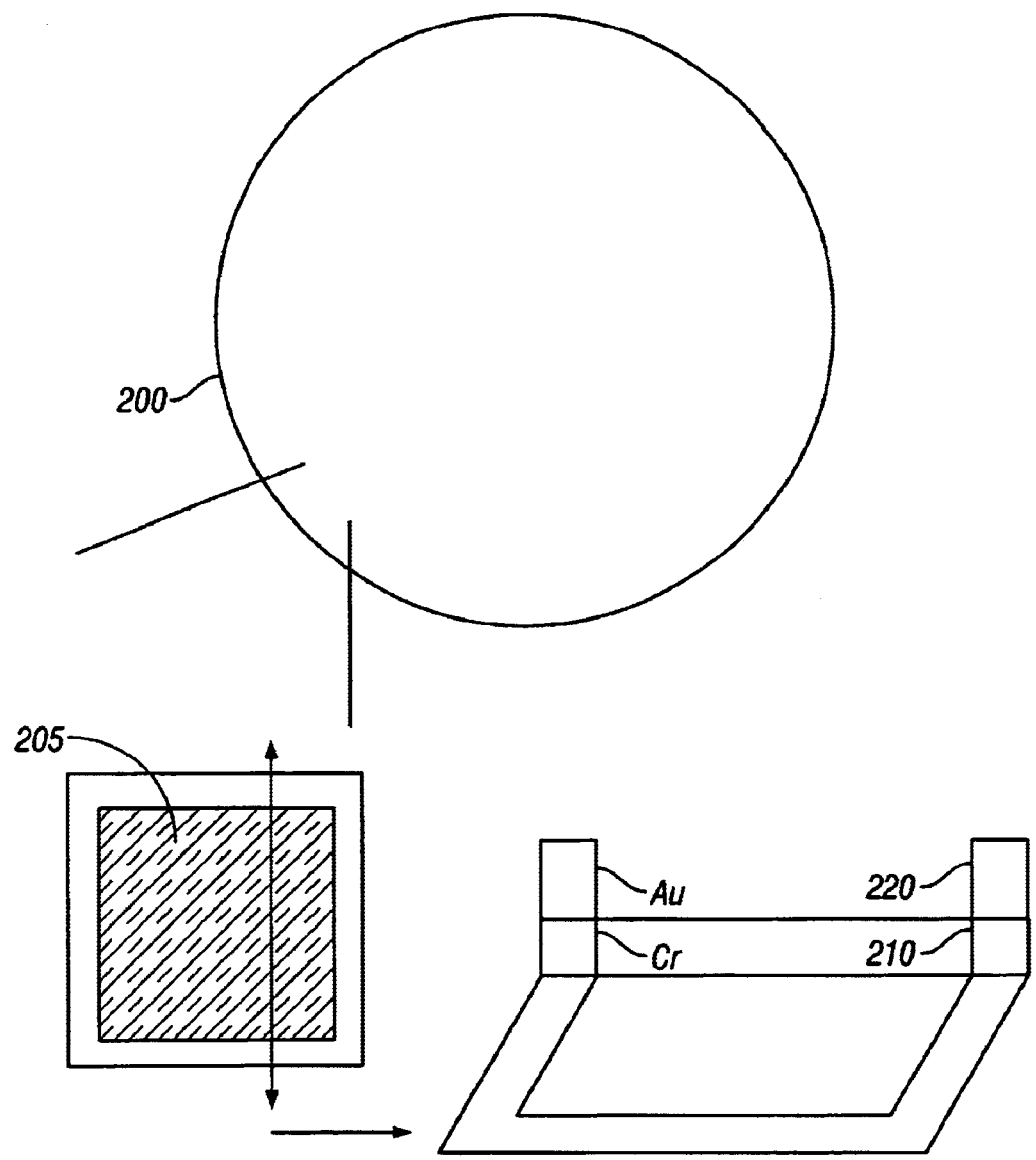
FIG. 2 shows a view of a silicon wafer.

The present application uses a system disclosed herein. Two four-inch silicon wafers are used. One of those wafers is shown as 200 in FIG. 2. A mask of photoresist 205 is provided to lithographically define a concentric square bond area. 150 Å of chromium is deposited as a first layer, followed by deposition of 1200 Å (0.12 µm) of gold as a second layer 220. The remaining photoresist 205 is then lifted off.

The wafer is etched in a solution of ethylenediamene+ pyrocathecol ("EDP") for about 80 minutes.

This produces pits of approximately 3 mm×100 µm deep. The pits are surrounded by a 2 mm wide plateau of gold on all sides.

If multiple parts. are formed on the wafer, the wafer can then be diced to form separated parts (102/104) shown in FIG. 1.

Microwave bonding is carried out, as shown in FIG. 1, in a cylindrical cavity 110 that may be excited by an azimuthally symmetric $TM_{010}$ mode at 2.45 GHz by a microwave source 122. The cavity can have a 12.7 centimeter diameter. The loaded Q of the empty cavity may be approximately 2500.

The first substrate 102 is simply placed on top of the second substrate 104 so that the deposited film patterns overlay. Microwave energy is applied in order to fuse the matching metallic parts on the two substrates. The high vacuum within the cavity in many cases is desired in order to form a vacuum within the cavity 130. This vacuum can also avoid the formation of an underscrable a plasma during the bonding process.

The only pressure applied comes from the wafer's weight.

The wafers are optimally placed at the area of the highest magnetic field intensity, and are oriented so their surfaces are parallel to the magnetic field.

Different power-time profiles can be used. Some of these are high power and short times, e.g. a 300 watt pulse for 2–3 seconds. Others use the opposite, e.g., 30 seconds at 100 watts or less. Different time-power profiles can be used with different materials and substrate sizes and position in the cavity.

The hermetic seal in the cavity is maintained for over a year is quite good. Moreover, since the cavity can be formed within silicon, it can be small, e.g. less than 5 µm in diameter, more preferably less than 1 µm which may be desirable for MEMS devices.

The above has disclosed bonding MEMS wafers together and forming hermetically sealed enclosures using a single mode microwave cavity. The concentration of the heat on the metal films join the two surfaces together without external pressure. The substrates temperature rise only slightly and due mostly to heat being transferred from the metal films. Metal diffusion into the silicon substrates is relatively limited because of short film required for the bonding.

Different combinations of substrates and metallic layers, such as platinum-titanium, copper, aluminum are contemplated.

Figure 3:
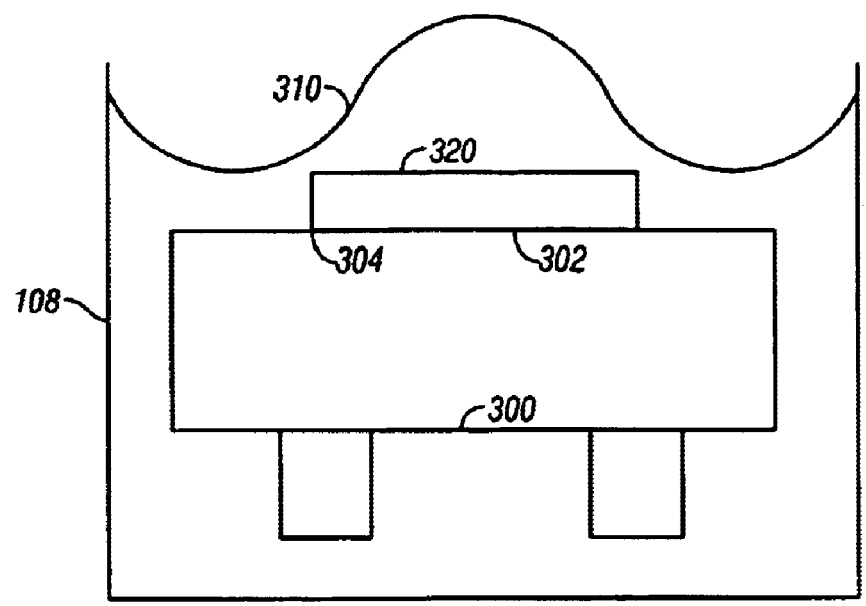
FIG. 3 shows a system for correcting for non-uniform heating.

Another embodiment is shown in FIG. 3. If the sample 300 is very large, e.g., greater than 10% of the size of the microwave wavelength 310, then the microwaves may actually induce a heat gradient along the substrate. For example, the microwave may have a sinusoidal shape in the cavity shown as sinusoid 310. This would mean that the heating effect would be greatest at the area 302, and somewhat less at the area 304. A heat conducting plate 320 is added to either the top of the silicon wafer 300. The heat plate 320 can be made of, for example, a sapphire material.

This system can avoid the uneven heating effect which could otherwise could not be avoided no matter where the sample was placed in the cavity.

Figure 4:
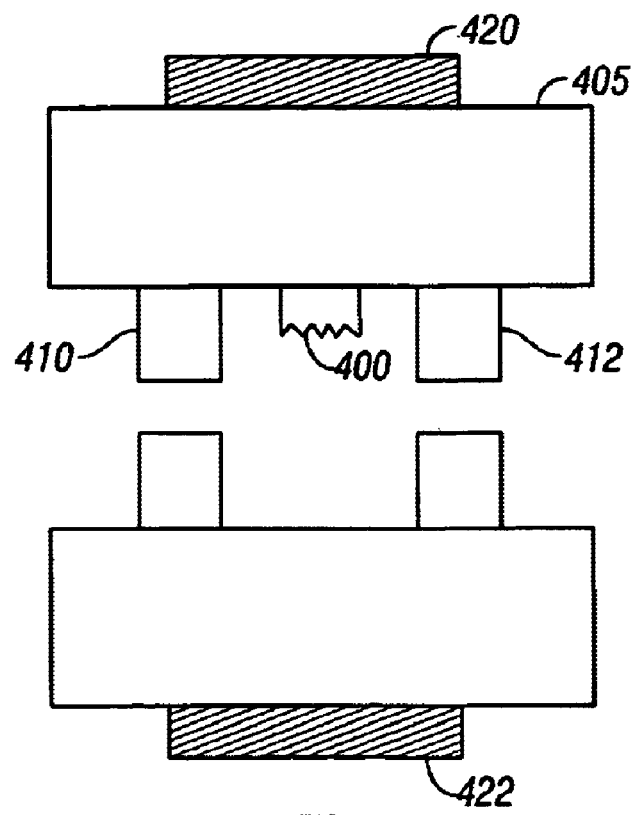
FIG. 4 shows a heating protection element for a semiconductor wafer.

Another embodiment shown in FIG. 4 recognizes that some materials may actually require one or more electronic components such as a transistor and/or electrical leads shown as 400 on the silicon wafer 405. The system preferentially heats the metallizations 410, 412. The microwave heating may also heat the circuitry 400, especially if the circuitry 400 includes metal. This system places at least one shield element 420, 422 on the substrate surface so as to block the microwave energy from penetrating the substrate and heating the component 400. This should cover about ⅔ of the surface. This shield element can reduce, at least somewhat, the heating effect of the microwave energy.

Figure 5:
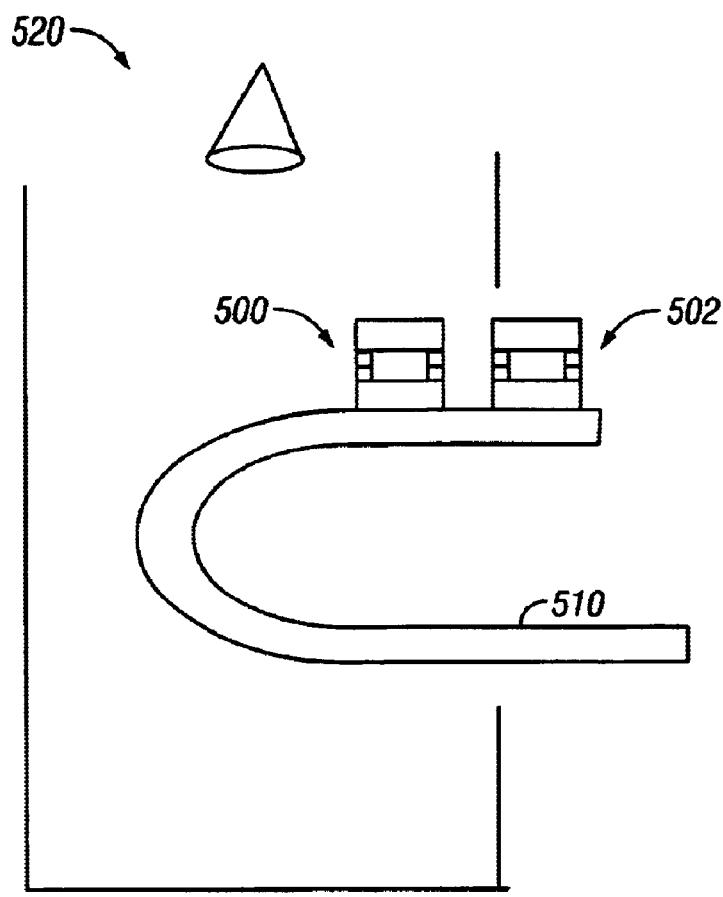
FIG. 5 shows a high speed bonding system.

An automation system is shown in FIG. 5. A number of samples, 500, 502 are placed on a conveyor element 510. The conveyor element can be a set of non metallic support wires or a belt for example. The conveyor element takes each of the samples into the microwave area 520, and irradiates them with microwave while they are in the area. After the irradiation, the samples can be removed from the area by moving the conveyor element.

Items can be loaded onto the conveyor 510 in advance. If vacuum is desired, the entire operation shown in FIG. 5 can actually be within a vacuum.

Figure 6:
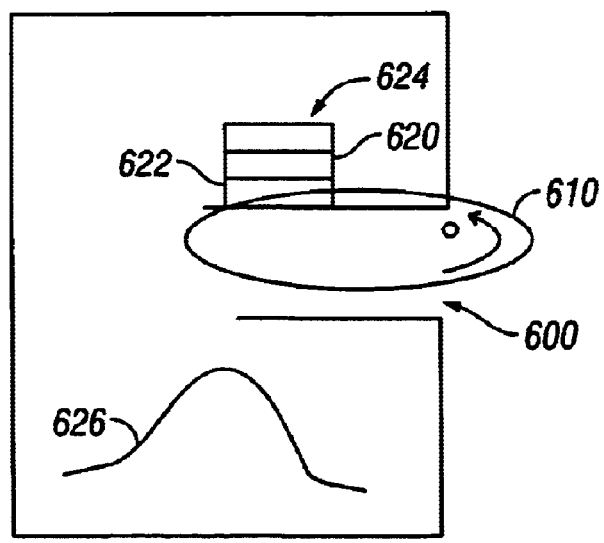
FIG. 6 shows a system for processing a large sized wafer.

FIG. 6 shows a system in which two wafers to be bonded are inserted into the chamber through a slit 600 in the chamber. The wafers are round and are rotated together, as shown by the arrow 610. Each portion of the wafer that enters the chamber is heated during the time it is in the chamber. This allows simultaneous bonding at multiple positions larger wafers in a relatively small chamber.

According to a particular embodiment, the metallization 620 at various positions is formed of a graded material using metals of varying melting points. The material towards the end 622 has a higher melting point, while the material towards the end 624 has a lower melting point. The microwave energy may follow the curve 626 shown in FIG. 6. Therefore, more microwave energy is presented at the area 622 and less at the area 624.

Other modifications are contemplated.

What is claimed is:

1. A method comprising:

placing a first semiconductor substrate with a first metal part against a second semiconductor substrate with a second metal part;

aligning said first metal part with said second metal part; and applying microwave energy to the first and second substrates to bond the first substrate to the second substrate.

2. A method as in claim 1, wherein the first substrate is placed on top of the second substrate, and is held only by gravity during bonding.

3. A method as in claim 1, wherein said bonding includes hermetically sealing a cavity.

4. A method as in claim 3, wherein one of said metal portions includes an indented part and said hermetically sealing comprises hermetically sealing completely said cavity, to form a hermetically sealed cavity inside the indented part.

5. A method as in claim 2, wherein said metal is gold.

6. A method as in claim 5, wherein said substrate are silicon.

7. A method as in claim 1, wherein said first part has an outer surface formed of a material with a low imaginary dielectric constant e".

8. A method, comprising;

providing a semiconductor substrate having a first portion first material with a first metallic portion;

providing a second material, having a second metallic portion; and using microwave energy to bond the first metallic portion to the second metallic portion without heating the semiconductor portion significantly.

9. A method as in claim 8, wherein said first portion is held on the second portion by gravity only.

10. A method as in claim 9, wherein the first portion includes an indented portion therein, and said bonding comprises hermetically sealing around an outside of the indented portion.

* * * * *